(12) United States Patent
Numata

(10) Patent No.: US 6,902,648 B2
(45) Date of Patent: Jun. 7, 2005

(54) PLASMA ETCHING DEVICE

(75) Inventor: Takeomi Numata, Kanagawa (JP)

(73) Assignee: Oki Electric Industry Co., Ltd., Tokyo (JP)

(*) Notice: Subject to any disclaimer, the term of this patent is extended or adjusted under 35 U.S.C. 154(b) by 140 days.

(21) Appl. No.: 10/338,907

(22) Filed: Jan. 9, 2003

(65) Prior Publication Data
US 2004/0134612 A1 Jul. 15, 2004

(51) Int. Cl.$^7$ .................. C23F 1/12; H01L 21/306; C23C 16/509
(52) U.S. Cl. ............... 156/345.47; 156/345.43; 156/345.44; 118/723 E; 118/723 R
(58) Field of Search ............. 269/21; 156/345.43, 156/345.44, 345.45, 345.46, 345.47; 118/719, 728, 729

(56) References Cited

U.S. PATENT DOCUMENTS

| | | | | |
|---|---|---|---|---|
| 4,392,915 A | * | 7/1983 | Zajac | ............ 438/716 |
| 5,937,541 A | * | 8/1999 | Weigand et al. | ............ 34/565 |
| 6,638,004 B2 | * | 10/2003 | Berger et al. | ............ 414/800 |

FOREIGN PATENT DOCUMENTS

| | | |
|---|---|---|
| JP | 08-115905 | 5/1996 |
| JP | 2000-345348 | 12/2000 |
| JP | 2002-043276 | 2/2002 |

* cited by examiner

Primary Examiner—Rudy Zervigon
(74) Attorney, Agent, or Firm—Volentine Francos & Whitt PLLC (57) ABSTRACT

A plasma etching device including a supply path supplying temperature adjustment gas into a process chamber, wherein the temperature adjustment gas is supplied, and a temperature of an interior of the process chamber is controlled, is disclosed. After etching of a wafer is completed, a control valve of the supply path is opened, and the temperature adjustment gas is supplied into the process chamber. A temperature of the temperature adjustment gas is adjusted to a target gas temperature corresponding to an ambient temperature of the interior of the process chamber, or the like. The high-temperature gas remaining in the process chamber is replaced by the temperature adjustment gas supplied from respective nozzle ports, whereby the interior of the process chamber can be cooled to a target temperature with high accuracy in a short amount of time.

6 Claims, 6 Drawing Sheets

PLASMA ETCHING DEVICE

BACKGROUND OF THE INVENTION

1. Field of the Invention

The present invention relates to a plasma etching device used for wafer etching or the like in a semiconductor device manufacturing process.

2. Description of the Related Art

As a wafer etching device used in a semiconductor device manufacturing process, there is known a plasma etching device for etching (dry-etching) a wafer mounted on a cathode electrode using plasma by applying RF power to an upper electrode (anode electrode) and a lower electrode (cathode electrode) arranged to face each other in an evacuated process chamber to generate plasma between the anode and cathode electrodes while supplying etching gas which contains chlorine gas ($Cl_2$) into the process chamber.

The plasma etching device stated above is known as follows. If a plurality of wafers are continuously etched, an etching quantity, i.e., etching rate for the wafers per unit time changes (increases or decreases) over time in accordance with an increase in the number of processed wafers even if etching conditions including the RF power applied to the electrodes and the quantity of the etching gas supplied into the process chamber are controlled to be constant. The etching rate change is considered to be caused by changes over time (normally increases) in the ambient temperature of the interior of the process chamber and the temperatures of various members including the electrodes, a gas ring for supplying the process gas, the inner wall surface of the process chamber and the like due to the plasma and the heat generated from the electrodes during etching, and by changes in the composition and density of the plasma and the quantity of deposits adhering to the inner wall surface of the process chamber due to these temperature changes.

Some conventional plasma etching device has a cooler and a heater provided at electrodes or the wall portion of the process chamber so as to prevent etching rate from changing according to an increase in the number of processed wafers, and has a temperature sensor for detecting the temperatures of the electrodes, the wall portion of the process chamber and the like, arranged therein. The plasma etching device controls the temperatures of the electrodes and the inner wall portion of the process chamber to be constant based on the temperatures detected by the temperature sensor, and thereby suppresses the change of etching rate due to the increase in the number of processed wafers.

Further, a plasma film formation device for forming an insulating film on a substrate within a vacuum bath using plasma gas is disclosed by Japanese Patent Application Laid-Open (JP-A) No. 2000-345348, page 4, FIG. 1 and the like. In the plasma film formation device, in cases where insulating films are continuously formed on a plurality of substrates, cooling gas such as $N_2$ is supplied to a shower plate provided with a gas port for supplying film formation gas into the vacuum bath after the completion of forming a film on the preceding substrate and before the subsequent substrate is transported into the vacuum bath, and the cooling gas is introduced into the vacuum bath through the gas port of the shower plate, whereby increases in the ambient temperature of the interior of the vacuum bath and the temperature of the shower plate are suppressed.

However, the conventional plasma etching device which adjusts the temperatures of the members such as the electrodes and the wall portion of the process chamber using the cooler and the heater as described above, has the following disadvantage. The device can adjust the temperatures of these members themselves to respective target temperatures with high accuracy within relatively a short period of time. However, since the adjustment is made only using the heat conducted from these members, it is difficult to adjust the ambient temperature of the interior of the process chamber to the target temperature within a short period of time after the completion of etching one wafer and before the start of etching the next wafer.

Further, the plasma film formation device disclosed by the JP-A No. 2000-345348 has the following disadvantage. It is possible to efficiently decrease the ambient temperature of the interior of the vacuum bath and the temperature of the shower plate within a short period of time by introducing the cooling gas into the vacuum bath through the gas port of the shower plate. However, these temperatures cannot be accurately adjusted to respective target temperatures. That is, only by introducing the cooling gas into the vacuum bath for a certain period after the completion of forming a film on a preceding substrate and before the delivery of a subsequent substrate into the vacuum bath, it is impossible to accurately adjust the ambient temperature of the interior of the vacuum bath and the temperature of such a member as the shower plate that faces the interior of the vacuum bath to respective target temperatures if the quantity of the heat emitted when plasma is generated within the vacuum bath differs among the substrates or if the temperatures of the vacuum bath and the like rise over time due to by a regenerative reaction or the like.

SUMMARY OF THE INVENTION

The present invention has been made in view of the above-stated facts. It is an object of the invention to provide a plasma etching device capable of adjusting the ambient temperature of the interior of a process chamber and the temperature of a region facing the internal space of the process chamber to respective target temperatures with high accuracy in a short amount of time after the completion of etching an etching target material.

To achieve the object, according to a first aspect of the invention, there is provided a plasma etching device, including an airtight process chamber having arranged therein so as to face each other an upper electrode and a lower electrode which has an upper surface portion on which an etching target material is mounted, for generating plasma between the upper electrode and the lower electrode, and etching the etching target material, the plasma etching device comprising: a first gas supply path including an injection hole formed in the upper surface portion, the first gas supply path injecting cooling gas so as to cause the cooling gas to circulate between the lower electrode and the etching target material during etching; a second gas supply path including an injection hole formed at an outer peripheral region of the lower electrode, for injecting process gas into the process chamber during the etching; a third gas supply path in communication with the first and second gas supply paths, and supplying temperature adjustment gas into the process chamber from the injection holes of the first and second gas supply paths after etching of the etching target material is completed and the etching target material has been transported out of the process chamber; and a temperature adjuster adjusting a temperature of the temperature adjustment gas to be supplied by the third gas supply path into the process chamber.

In the plasma etching device according to the first aspect, the second gas supply path may further include at least one injection hole formed at the outer peripheral region of the lower electrode. A temperature sensor is provided in the process chamber, and the temperature adjuster adjusts the temperature of the temperature adjustment gas based on a temperature detected by the temperature sensor. The temperature sensor is arranged to detect at least one of an ambient temperature of an interior of the process chamber, a temperature of the upper electrode, a temperature of the lower electrode, and a temperature of a predetermined portion of an inner wall of the process chamber. The plasma etching device may further comprise a temperature controller, and the temperature controller stores a preset target temperature corresponding to the detected temperature, and controls the temperature adjuster so that the temperature of the temperature adjustment gas becomes equal to the target temperature corresponding to the detected temperature.

The plasma etching device may further comprise an exhaust path for exhausting the gases in the process chamber from the process chamber.

In the plasma etching device according to the first aspect, after etching of the etching target material is completed and the etching target material is transported out of the process chamber, the third gas supply path supplies the temperature adjustment gas into the process chamber through the first injection hole (nozzle port) and the second injection hole (nozzle port), respectively, and the temperature adjuster adjusts the temperature of the temperature adjustment gas supplied by the third gas supply path into the process chamber, whereby the high-temperature etching gas remaining in the process chamber is replaced by the temperature adjustment gas supplied from the injection hole of the first gas supply path (which will be sometimes abbreviated as "first injection hole or nozzle" hereinafter) and the injection hole of the second gas supply path (which will be sometimes abbreviated as "second injection hole or nozzle" hereinafter). The temperature adjustment gas directly cools the regions, such as the inner wall portion of the process chamber and the electrodes, which face the internal space of the process chamber. It is, therefore, possible to change the ambient temperature of the interior of the process chamber and the temperatures of the regions facing the internal space of the process chamber to temperatures corresponding to the temperature of the temperature adjustment gas in a short amount of time, respectively.

At this time, the temperature adjustment gas is evenly, uniformly supplied into the process chamber through the first injection hole formed in the upper surface portion of the lower electrode and a plurality of second injection holes provided on the outer peripheral side of the lower electrode along the circumferential direction. It is, therefore, possible to replace the residual gas and the like in the overall process chamber by the temperature adjustment gas in a short amount of time, and to make the temperature distribution in the process chamber uniform. Further, if the temperature of the temperature adjustment gas is adjusted by the temperature adjuster in accordance with the quantity of heat generated in the process chamber during the etching, or based on a detected temperature reading from the temperature sensor provided in the process chamber, it is possible to adjust the ambient temperature of the interior of the process chamber and the temperatures of the regions facing the internal space of the process chamber to target temperatures with high accuracy in a short amount of time within a certain period after etching of the etching target material is completed, respectively.

According to a second aspect of the invention, there is provided a plasma etching device, including an airtight process chamber having arranged therein so as to face each other an upper electrode and a lower electrode which has an upper surface portion on which an etching target material is mounted, for generating plasma between the upper electrode and the lower electrode, and etching the etching target material, the plasma etching device comprising: an airtight chamber which is provided near the process chamber, and which can be filled with gas, the airtight chamber including a communication path enabling the airtight chamber to communicate with the process chamber; a gas supply path for supplying temperature adjustment gas to the airtight chamber; a temperature adjuster for adjusting a temperature of the temperature adjustment gas to be supplied by the gas supply path so as to fill up in the airtight chamber; and a controller controlling opening and closing of the communication path so as to allow communication between the airtight chamber and the process chamber after etching of the etching target material has been completed, and so as to seal off the airtight chamber from the process chamber before starting etching of a next etching target material.

In the plasma etching device according to the second aspect, when the etching target material is etched, the temperature adjustment gas is supplied by the gas supply path (gas filling means) into the airtight chamber (gas filled chamber) to fill up the temperature adjustment gas in the airtight chamber, and the temperature adjuster adjusts the temperature of the temperature adjustment gas supplied by the gas supply path and filled up in the airtight chamber. After etching of the etching target material is completed, the controller opens the communication path to communicate the airtight chamber with the process chamber, and the communication path between the airtight chamber and the process chamber is closed before the start of the etching of the next etching target material. Thus, it is possible to replace the high-temperature etching gas remaining in the process chamber by the temperature adjustment gas supplied from the airtight chamber after etching of the etching target material is completed. In addition, it is possible to directly cool the inner wall portion of the process chamber and the regions such as electrode which face the internal space of the process chamber using the temperature adjustment gas, and to change the ambient temperature of the interior of the process chamber and the temperatures of the regions facing the internal space of the process chamber to temperatures corresponding to the temperature of the temperature adjustment gas in a short amount of time, respectively.

At this time, by setting the internal volume of the airtight chamber to be sufficiently large and setting the pressure of the temperature adjustment gas supplied by the gas supply path and filled up in the airtight chamber to be sufficiently high, it is possible to supply a large quantity of temperature adjustment gas into the process chamber in extremely short time, simultaneously with communicating the airtight chamber with the process chamber. Therefore, it is possible to replace the gases in the overall process chamber by the temperature adjustment gas and to make the temperature distribution of the interior of the process chamber uniform in relatively short time. Further, if the temperature of the temperature adjustment gas in the airtight chamber is adjusted by the temperature adjuster in accordance with the quantity of heat generated in the process chamber during the etching, or based on the detected temperature reading from the temperature sensor provided in the process chamber, it is possible to adjust the ambient temperature of the interior of the process chamber and the temperatures of the regions facing the internal space of the process chamber to target temperatures with high accuracy in a short amount of time within a certain period after etching of the etching target material, respectively.

Further, according to a third aspect of the invention, there is provided a plasma etching device, including an airtight process chamber having arranged therein so as to face each other an upper electrode and a lower electrode which has an upper surface portion on which an etching target material is mounted, for generating plasma between the upper electrode and the lower electrode, and etching the etching target material, the plasma etching device comprising: a transport member for transporting the etching target member into and out of the process chamber; an air current generator having an air current discharge port provided on the transport member, and supplying an air current from the air current discharge port into the process chamber when the transport member is inserted into the process chamber; and a temperature adjuster for adjusting a temperature of the air current to be supplied by the air current generator into the process chamber.

In the plasma etching device according to the third aspect, when the transport member is inserted into the process chamber, the air current generator (air current supply means) supplies an air current into the process chamber through the discharge port provided in the transport member, and the temperature adjuster adjusts the temperature of the air current supplied by the air current generator into the process chamber. As a result, the high-temperature etching gas remaining in the process chamber is stirred and replaced by the air current supplied from the discharge port, and the regions, such as the inner wall portion of the process chamber and the electrodes, which face the internal space of the process chamber are cooled by the air current. It is, therefore, possible to change the ambient temperature of the interior of the process chamber and the temperatures of the regions facing the internal space of the process chamber to the temperatures corresponding to the temperature of the air current in a short amount of time, respectively.

At this time, the air current is supplied into the process chamber through the discharge port provided in the transport member for transporting the etching target material. Therefore, it is possible to adjust the internal temperature of the process chamber while making use of the time after etching of one etching target material is completed and before the next etching target material is transported into the process chamber and etching of the next etching target material starts. Further, if the temperature of the air current is adjusted by the temperature adjuster in accordance with the quantity of heat generated in the process chamber during the etching, or based on the detected temperature reading from the temperature sensor provided in the process chamber, it is possible to adjust the ambient temperature of the interior of the process chamber and the temperatures of the regions facing the internal space of the process chamber to target temperatures with high accuracy in a short amount of time within a certain period after etching of the etching target material is completed, respectively.

BRIEF DESCRIPTION OF THE DRAWINGS

FIGS. 2A and 2B are cross-sectional side views showing the schematic configuration of the plasma etching device shown in FIG. 1; i.e., FIG. 2A shows a state in which the internal pressure of a process chamber is reduced, and FIG. 2B shows a state in which a wafer is etched.

FIGS. 3A and 3B are cross-sectional side views showing the schematic configuration of the plasma etching device shown in FIG. 1; i.e., FIG. 3A shows a state in which one wafer is exchanged to the other wafer, and FIG. 3B shows a state in which the interior of the process chamber is cooled.

FIGS. 5A and 5B are cross-sectional side views showing the schematic configuration of a plasma etching device according to a second embodiment of the invention; i.e., FIG. 5A shows a state in which a wafer is etched, and FIG. 5B shows a state in which one wafer is exchanged to the other wafer and the interior of a process chamber is cooled.

DESCRIPTION OF THE PREFERRED EMBODIMENTS

Plasma etching devices according to embodiments of the present invention will be described below with reference to the drawings.

First Embodiment

Figure 1:
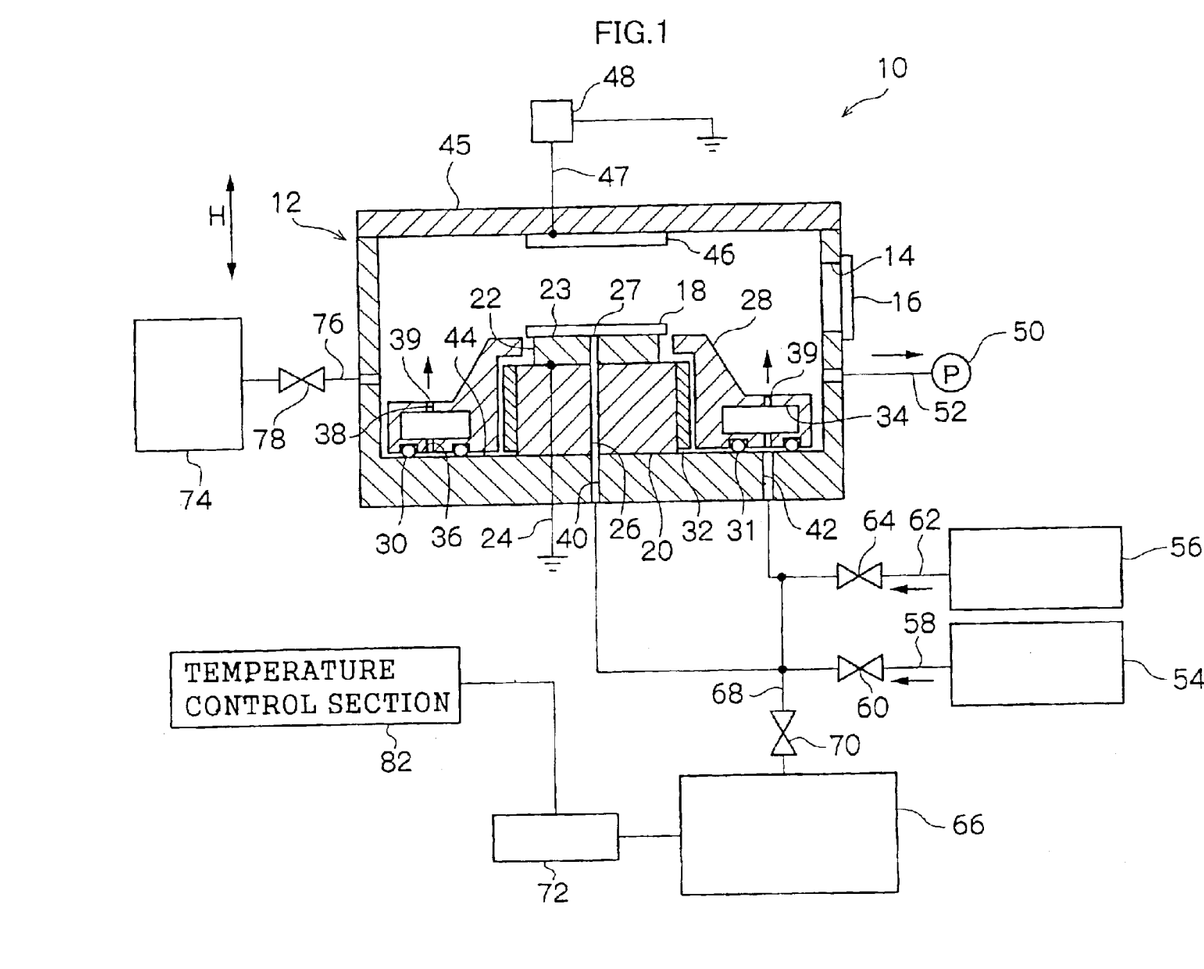
FIG. 1 is a cross-sectional side view showing the schematic configuration of a plasma etching device according to a first embodiment of the present invention.

FIG. 1 shows a plasma etching device 10 according to a first embodiment of the invention. The plasma etching device 10 is provided with a process chamber 12 which is a container having airtightness and heat resistance. The process chamber 12 is formed wholly, generally into a cylindrical shape. An opening portion 14 for delivering a wafer 18, which is an etching target material, in and out of the process chamber 12 is formed in the peripheral wall portion of the process chamber 12. In addition, an airtight door 16 for opening and closing the opening portion 14 is provided on the peripheral wall portion thereof.

In the process chamber 12, a cylindrical electrode support 20 is attached onto a base plate 44 of the process chamber 12. A disk-like cathode electrode 22 is fixed to the upper surface of the electrode support 20. The cathode electrode 22 is grounded to a ground portion of the device through a ground cable 24. Further, a pipe-like gas support path 26 is provided in the central portions of the electrode support 20 and the cathode electrode 22 along a vertical direction (an arrow H direction). An opening end above the gas supply path 26 is opened to the upper surface of the cathode electrode 22, which constitutes a nozzle port 27 for injecting cooling gas into the process chamber 12.

The upper surface portion of the cathode electrode 22 serves as a mount surface 23 of the wafer 18 which is an etching target material. The wafer 18 delivered into the process chamber 12 through the opening portion 14 is mounted on the mount surface 23. During etching, a trace of cooling gas is injected from the nozzle port 27 of the cathode electrode 22. The cooling gas flows between the mount surface 23 and the lower surface portion of the wafer 18 from the center toward the outer peripheral side and cools the wafer 18 and the cathode electrode 22. Further, a wafer elevation mechanism (not shown) is included in the electrode support 20 and the cathode electrode 22. By protruding a plurality of (e.g., three) slide pins (not shown) disposed in the cathode electrode 22 from the mount surface 23, the wafer elevation mechanism lifts the wafer 18 upward of the cathode electrode 22. By lowering the slide pins into the cathode electrode 22, the elevation mechanism mounts the wafer 18 on the mount surface 23 of the cathode electrode 22.

In the process chamber 12, an annular gas ring 28 is arranged on the outer peripheral portion of the electrode support 20 on the base plate 44. O rings 30 and 31 having different diameters are arranged concentrically on the lower surface of the gas ring 28. Through the O rings 30 and 31, the gas ring 28 is mounted on the base plate 44 of the process chamber 12. A cylindrical insulating member 32 is inserted between the inner peripheral surface of the gas ring 28 and the outer peripheral surface of the electrode support 20. The insulating member 32 insulates the gas ring 28 from the electrode support 20 and the cathode electrode 22.

An annularly extending hollow chamber 34 is formed in the gas ring 28 in a circumferential direction to make the gas ring 28 hollow. A plurality of gas supply paths 36 which penetrate through the lower surface portion of the gas ring 28 from the bottom surface portion of the interior of the hollow chamber 34, and a plurality of gas supply paths 38 which penetrate through the upper surface portion of the gas ring 28 from the top surface portion of the interior of the hollow chamber 34, are provided in the gas ring 28. Here, the plural gas supply paths 36 are arranged along the peripheral direction almost at equal pitches, and openings on the lower ends thereof are opened between the O rings 30 and 31, respectively. Likewise, the plural gas supply paths 38 are arranged along the peripheral direction almost at equal pitches, and openings on the upper ends thereof serve as nozzle ports 39 for injecting process gas into the process chamber 12.

Pipe-like intermediate connection holes 40 and 42 penetrates through the central portion and the outer peripheral side of the base plate 44 of the process chamber 12, respectively. An opening on the upper end of the intermediate connection hole 40 is connected to the opening on the lower end of the gas supply path 26 in the electrode support 20. An opening on the upper end of the intermediate connection hole 42 is opened into an annular space formed between the O rings 30 and 31 and connected to the gas supply path 36 in the gas ring 28 through the annular space.

In the process chamber 12, a disk-like anode electrode 46 is attached to the central portion of the lower surface of the top plate 45 of the process chamber 12. The anode electrode 46 faces the cathode electrode 22 with a predetermined distance given therebetween. An RF power supply 48 which is disposed outside of the process chamber 12 through a cable 47, is connected to the anode electrode 46. The RF power supply 48 applies an RF voltage to the anode electrode 46 when etching the wafer 18 mounted on the cathode electrode 22.

The plasma etching device 10 is provided with a vacuum generator 50 such as a vacuum pump which evacuates the process chamber 12. The vacuum generator 50 is connected to the process chamber 12 through a vacuum piping 52. The vacuum generator 50 sucks in the air and residual gas from the process chamber 12 which turns airtight by closing the airtight door 16 prior to the start of etching of the wafer 18, keeping the interior of the process chamber 12 to have a predetermined degree of vacuum.

The plasma etching device 10 is provided with a cooling gas tank 54 for supplying the cooling gas into the process chamber 12 and a process gas tank 56 for supplying the process gas for etching into the process chamber 12, outside of the process chamber 12. Inert gas such as helium gas (He) is stored in the cooling gas tank 54 as cooling gas while being kept in a high pressure state at a predetermined temperature (e.g., 20° C.). Process gas which mainly consists of helium gas, for example, is stored in the process gas tank 56 while being kept in a high pressure state at a predetermined temperature (e.g., 20° C.).

The cooling gas tank 54 is connected to the intermediate connection hole 40 in the central portion of the process chamber 12 through a gas piping 58. A control valve 60 the opening and closing states of which can be controlled by a solenoid is arranged halfway along the gas piping 58. The control valve 60 controls whether or not the cooling gas is supplied from the cooling gas tank 54 into the process chamber 12. Likewise, the process gas tank 56 is connected to the intermediate hole 42 on the outer peripheral side of the process chamber 12 through a gas piping 62. A control valve 64 the opening and closing states of which can be controlled by a solenoid is arranged halfway along the gas piping 62. The control valve 64 controls whether or not the process gas is supplied from the process gas tank 56 into the process chamber 12.

The plasma etching device 10 is further provided with a temperature adjustment gas tank 66 which supplies temperature adjustment gas into the process chamber 12, outside of the process chamber 12. Helium gas (He), for example, is stored as the temperature adjustment gas in the temperature adjustment gas tank 66 while being kept in a high pressure state. The temperature adjustment gas tank 66 is connected to portions of the gas pipings 58 and 62 downstream from the control valves 60 and 64 by (via) a gas piping 68, respectively. In addition, a control valve 70 the opening and closing states of which can be controlled by a solenoid is arranged on a portion of the gas piping 68 upstream of the connected portions connected to the gas pipings 58 and 62. The control valve 70 controls whether or not the temperature adjustment gas is supplied from the temperature adjustment gas tank 66 to the gas pipings 58 and 62.

A temperature adjuster 72 is attached to the temperature adjustment gas tank 66. By heating or cooling the temperature adjustment gas by a heater or chiller provided inside the temperature adjuster 72 while circulating the temperature adjustment gas between the temperature adjuster 72 and the temperature adjustment gas tank 66, the temperature adjuster 72 adjusts a temperature of the temperature adjustment gas filling the temperature adjustment gas tank 66 to a predetermined target gas temperature. Alternatively, the temperature adjuster 72 may be structured so that the heater or chiller directly heats or cools the temperature adjustment gas contained in the temperature adjustment gas tank 66 to the target gas temperature.

The plasma etching device 10 is provided with an exhaust tank 74 which sucks in various gases present in the plasma chamber 12 and forcedly exhausts the various gases in the process chamber 12, outside of the process chamber 12. The exhaust tank 74 is connected to the process chamber 12 through an exhaust piping 76. An exhaust valve 78 the opening and closing states of which can be controlled by a solenoid is arranged halfway along the exhaust piping 76. The exhaust valve 78 controls whether or not the various gases are suck in from the process chamber 12.

The plasma etching device 10 is provided with a temperature control section 82 which consists of a CPU, a memory and the like. On the other hand, an ambient temperature sensor (not shown) which measures the ambient temperature of the interior of the process chamber 12, and a plurality of temperature sensors (not shown) which measure the surface temperatures of predetermined measurement target regions such as the electrodes 22 and 46 arranged in the process chamber 12 and the inner wall portion of the process chamber 12, respectively, are arranged in the process chamber 12. The ambient temperature sensor and surface temperature sensors output detection signals corresponding to the ambient temperature of the interior of the process chamber 12 and the surface temperatures of the measurement target regions, respectively, to the temperature control section 82.

A data table, in which target gas temperatures are set using the measured values of the ambient temperature of the interior of the process chamber 12 and the surface temperatures as parameters, is provided in the memory of the temperature control section 82. Just after etching of one wafer 18 is completed, the temperature control section 82 determines the measured values of the ambient temperature of the interior of the process chamber 12 and the surface temperatures based on the detection signals from the ambient temperature sensor and the surface temperature sensors, respectively, and reads the target gas temperature corresponding to the measured values of the ambient temperature and the surface temperatures from the data table.

Next, the operation of the plasma etching device 10 in the first embodiment constituted as stated above will be described with reference to FIGS. 2A to 5B. In FIGS. 2A to 5B, if the valves 60, 64, 70, and 78 are shown black, this indicates that they are closed, and if shown white, this indicates that they are opened.

Figure 2A:
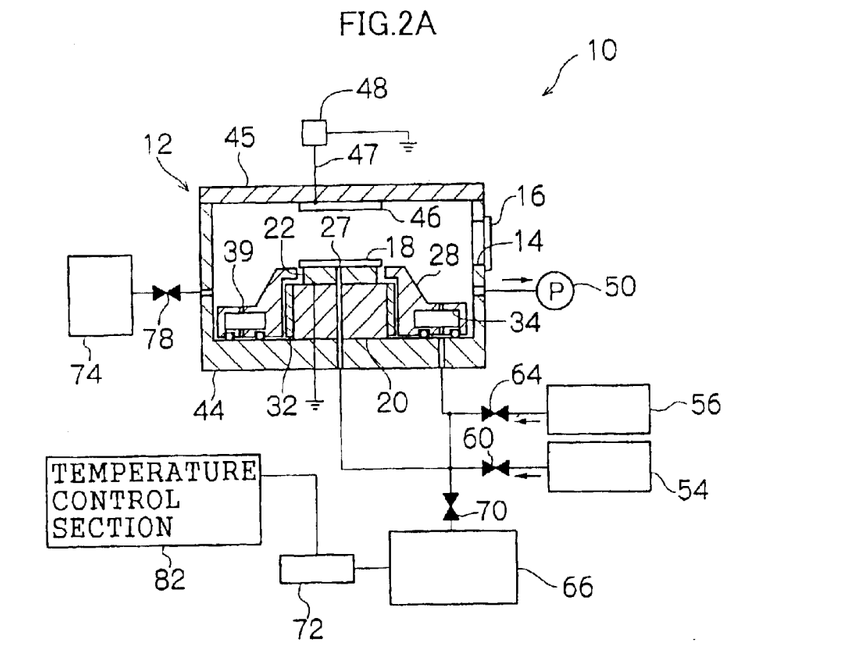
Figure 2B:
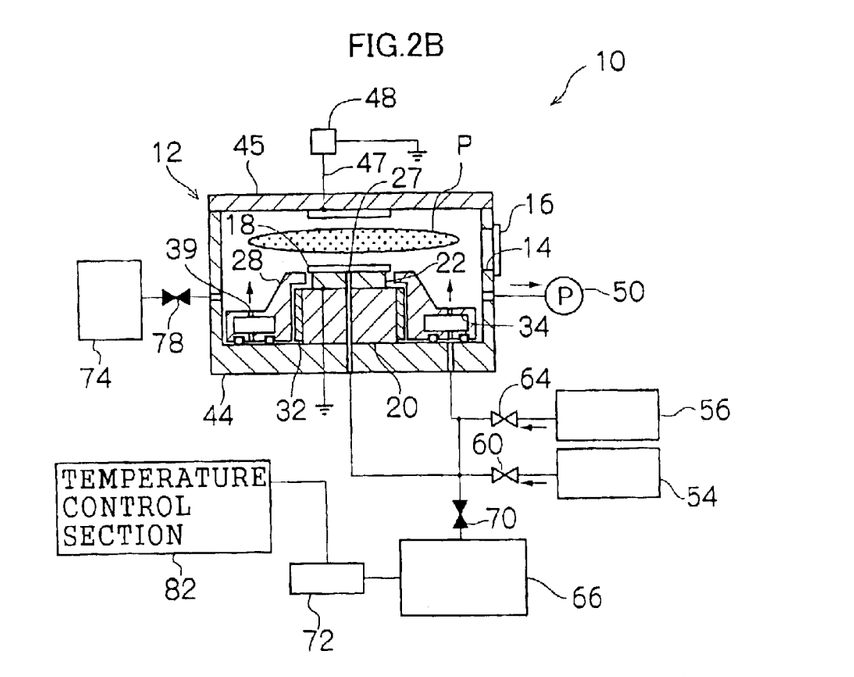

In the plasma etching device 10, when the wafer 18 is mounted on the cathode electrode 22 first, the airtight door 16 is closed to set the process chamber 12 airtight, and the vacuum generator 50 is actuated to reduce the internal pressure of the process chamber 12 to have a predetermined degree of vacuum, as shown in FIG. 2A. In the plasma etching device 10, if the internal pressure of the process chamber 12 is reduced to have the predetermined degree of vacuum, the control valve 60 is opened to thereby supply the cooling gas to the region between the mount surface 23 of the cathode electrode 22 and the wafer 18, and the control valve 64 is opened to thereby supply the process gas from the nozzle ports 39 into the process chamber 12, as shown in FIG. 2B. At this moment, the process gas can be uniformly diffused into the process chamber 12 in a short amount of time since the internal pressure of the process chamber 12 is reduced.

Thereafter, in the plasma etching device 10, an RF voltage is applied from the RF power supply 48 to the anode electrode 46, thereby generating plasma P between the electrodes 22 and 46 and etching the wafer 18 using the plasma P, as shown in FIG. 2B. At this moment, heat is generated simultaneously with the plasma P in the process chamber 12. Thus, in the plasma etching device 10, coolers (not shown) such as chillers provided on the inner wall portions of the process chamber 12, the electrodes 22 and 46, and the like, respectively, are normally actuated to suppress the surface temperatures of the inner wall portion of the process chamber 12 and the electrodes 22 and 46 from rising and suppress etching rate from changing according to the temperature rise.

Figure 3A:
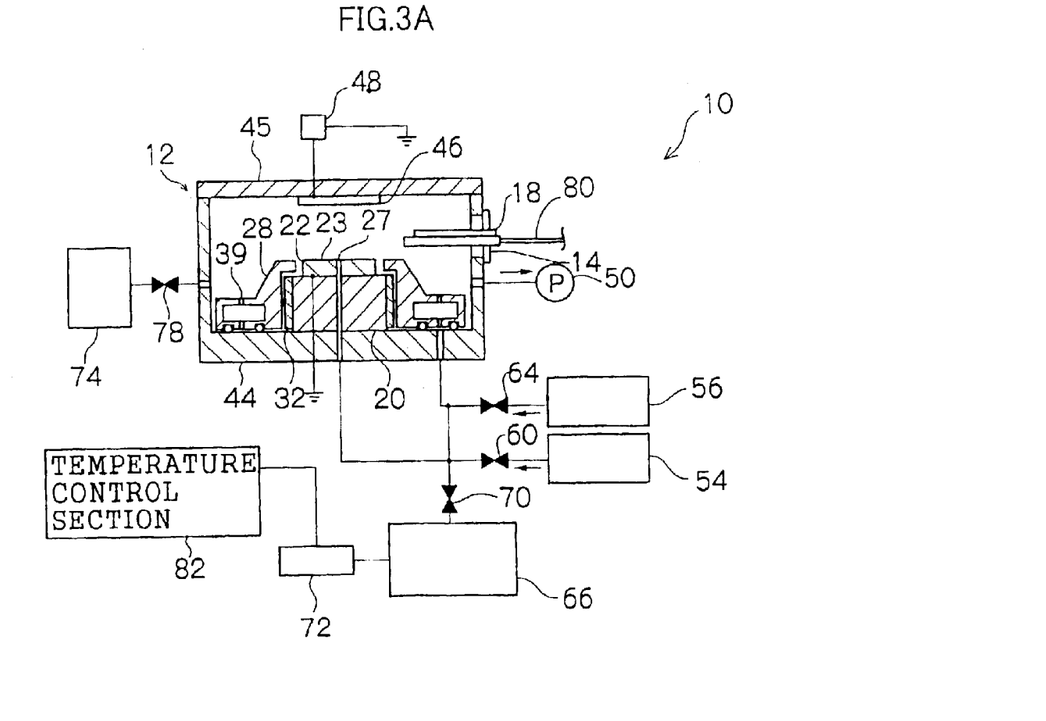

In the plasma etching device 10, when etching time which is set according to the type or the like of the wafer 18, passes, the RF power supply 48 is turned off and the control valves 60 and 64 are closed. Thereafter, an exhaust valve (not shown) provided in the process chamber 12 is opened to introduce the atmospheric air into the process chamber 12 to thereby return the internal pressure of the process chamber 12 to atmospheric pressure. In the plasma etching device 10, the airtight door 16 is opened next, a transport arm 80 is inserted into the process chamber 12 through the opening portion 14, and the wafer 18, having been etched is transported out of the process chamber 12 by the transport arm 80, as shown in FIG. 3A.

In the plasma etching device 10, after transporting the wafer 18 out of the process chamber 18, the airtight door 16 is closed to set the process chamber 12 airtight. At this moment, the temperature control section 82 determines the ambient temperature in the process chamber 12 and the surface temperatures of the predetermined regions based on the detection signals output from the ambient temperature sensor and the surface temperature sensors disposed in the process chamber 12, respectively, reads the target gas temperature of the temperature adjustment gas from the data table using these measured temperatures as parameters, and controls the temperature adjuster 72 so that the temperature adjustment gas in the temperature adjustment gas tank 66 becomes equal to the target gas temperature.

Figure 3B:
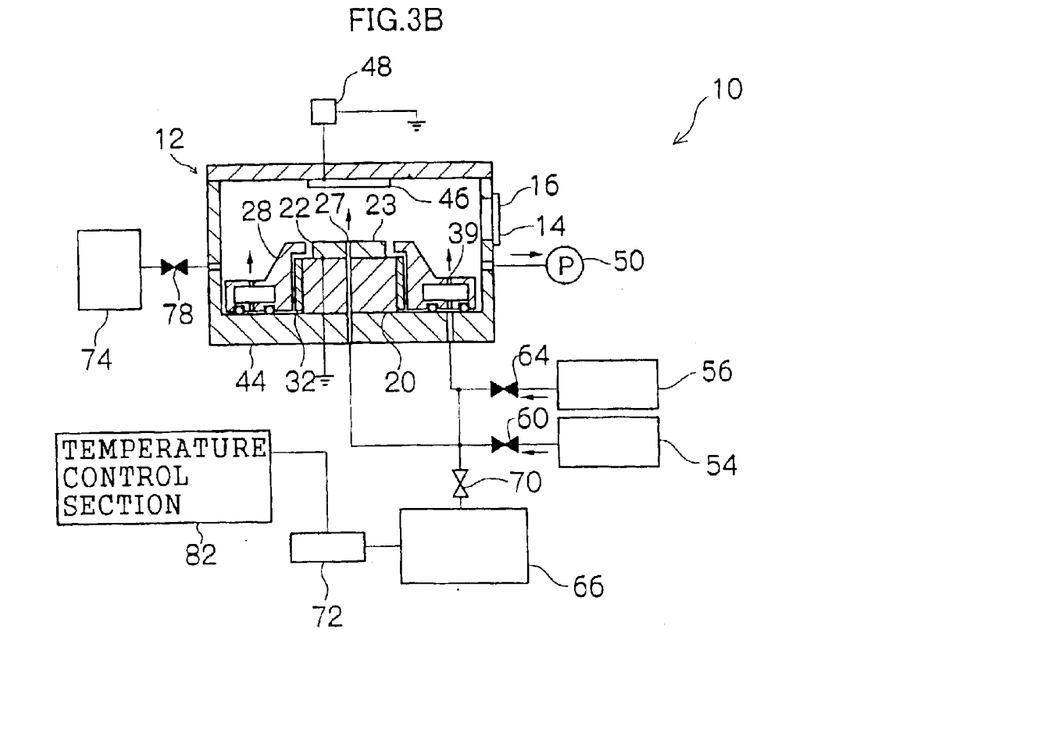

In the plasma etching device 10, after adjusting the temperature adjustment gas in the temperature adjustment gas tank 66 to the target gas temperature, the control valve 70 is opened, as shown in FIG. 3B. As a result, the temperature adjustment gas in the temperature adjustment gas tank 66 is injected into the process chamber 12 through the nozzle port 27 of the cathode electrode 22 and the nozzle ports 39 of the gas ring 28. At this moment, the temperature adjustment gas is injected from the nozzle port 27 located in the central portion of the process chamber 12 and a plurality of nozzle ports 39 located in the outer peripheral portion of the process chamber 12 along the peripheral direction, respectively. Therefore, the temperature adjustment gas is uniformly diffused into the internal space of the process chamber 12 in a short amount of time.

Figure 4:
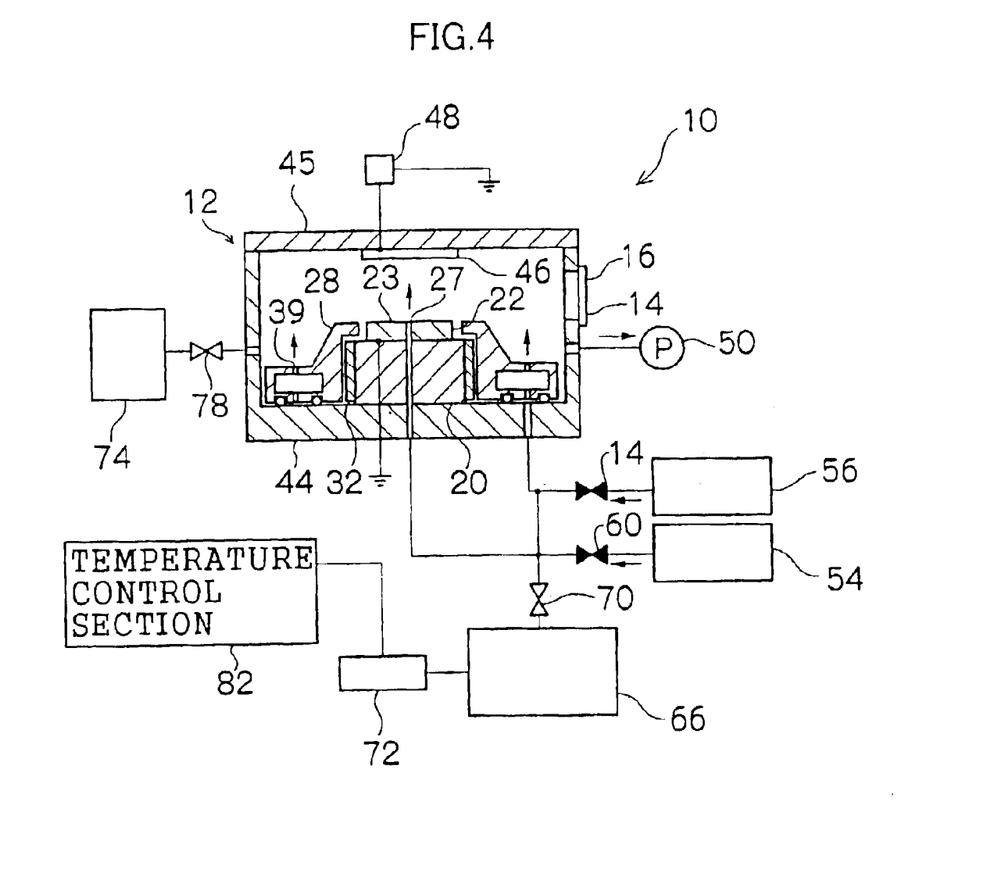
FIG. 4 is a cross-sectional side view showing the schematic configuration of the plasma etching device shown in FIG. 1, and showing a state in which temperature adjustment gas is exhausted from the process chamber.

After opening the control valve 70, if the internal pressure of the process chamber 12 is raised to predetermined set pressure by the temperature adjustment gas, the exhaust valve 78 is opened for predetermined opening time to thereby exhaust the temperature adjustment gas in the process chamber 12 and the residual gas after the etching into the exhaust tank 74 in the plasma etching device 10, as shown in FIG. 4. In the plasma etching device 10, after the passage of the opening time, the exhaust valve 78 is closed, the pressurization of the interior of the process chamber 12 by the temperature adjustment gas and the gas exhaustion from the interior of the process chamber 12 into the exhaust tank 74 are repeatedly conducted just before the airtight door 16 is opened in order to transport the next etching target wafer 18 into the process chamber 12.

In the plasma etching device 10 according to the first embodiment described so far, after the wafer 18 has been etched and transported out of the process chamber 12, the control valve 70 is opened to thereby supply the temperature adjustment gas into the process chamber 12 through the nozzle ports 27 and 39, and the temperature of the temperature adjustment gas is adjusted to the target gas temperature corresponding to the ambient temperatures of the interior of the process chamber 12 and the surface temperatures. As a result, the high-temperature etching gas remaining in the process chamber 12 is replaced by the temperature adjustment gas supplied from the respective nozzle ports 27 and 39, and the temperature adjustment gas directly cools the regions, such as the inner wall portion of the process chamber 12 and the electrodes 22 and 46, which face the internal space of the process chamber 12. It is, therefore, possible to change the ambient temperature of the interior of the process chamber 12 and the temperatures of the regions facing the internal space of the process chamber 12 to temperatures corresponding to the temperature of the temperature adjustment gas in a short amount of time, respectively.

At this time, the temperature adjustment gas is evenly, uniformly supplied into the process chamber 12 through the nozzle port 27 formed in the upper surface portion of the cathode electrode 22 and the plural nozzle ports 39 provided on the outer peripheral side of the cathode electrode 22 along the circumferential direction. It is, therefore, possible to replace the residual gas and the like in the overall process chamber 12 by the temperature adjustment gas in a short amount of time, and to make the temperature distribution in the process chamber 12 uniform. Alternatively, when supplying the temperature adjustment gas into the process chamber 12, the temperature of the temperature adjustment gas may be feedback-controlled by the temperature adjuster 72 based on the detection signals from the ambient temperature sensor and the surface temperature sensors provided in the process chamber 12 to thereby adjust the ambient temperature of the interior of the process chamber 12 and the temperatures of the predetermined regions.

Further, the temperature of the temperature adjustment gas in the temperature adjustment gas tank 66 is adjusted by the temperature adjuster 72 based on the temperatures detected by the temperature sensors provided in the process chamber 12. It is, therefore, possible to adjust the ambient temperature of the interior of the process chamber 12 and the temperatures of the regions facing the internal space of the process chamber 12 to the respective target temperatures with high accuracy in a short amount of time within a certain period after etching of the wafer 18 is completed, and to effectively suppress the change of the etching rate due to excessive cooling or insufficient cooling.

Furthermore, in the plasma etching device 10 in this embodiment, the hollow chamber 34 is formed in the gas ring 28 to make the gas ring 28 hollow, and the temperature adjustment gas supplied into the process chamber 12 circulates in the hollow chamber 34. It is, therefore, possible to effectively adjust the temperature of the gas ring 28, in particular, to the temperature corresponding to the temperature of the temperature adjustment gas.

Second Embodiment

A plasma etching device 90 according to a second embodiment of the invention will be described with reference to FIGS. 5A and 5B. Constituent elements of the plasma etching device 90 according to the second embodiment of the invention that are the same as those of the plasma etching device 10 in the first embodiment are denoted by the same reference numerals, respectively, and will not be described herein.

Figure 5A:
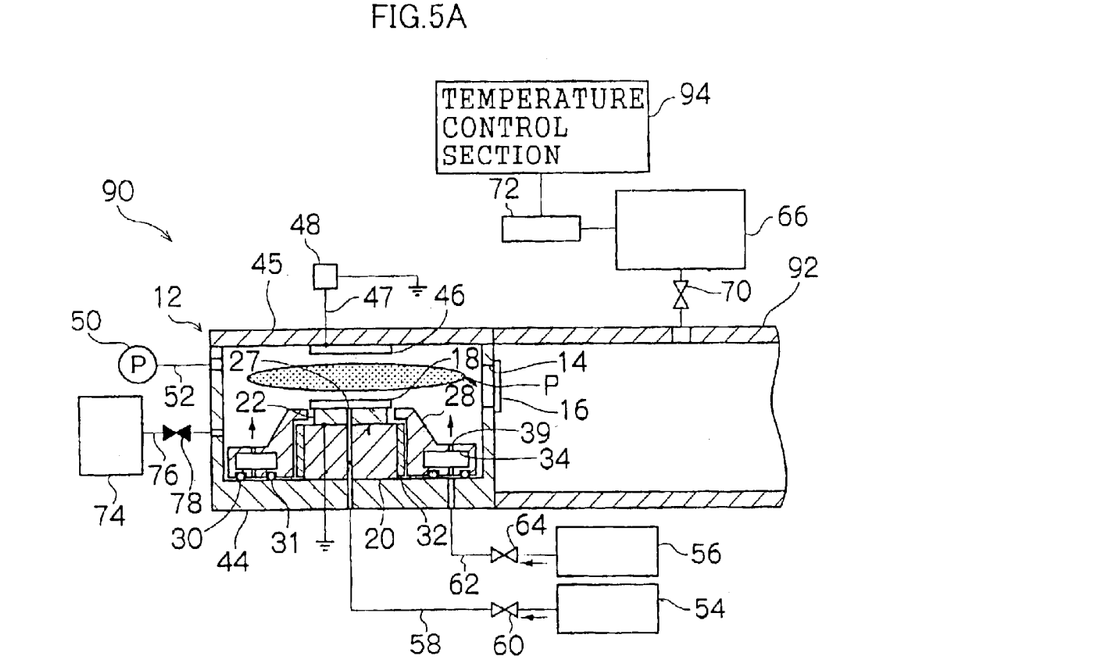
Figure 5B:
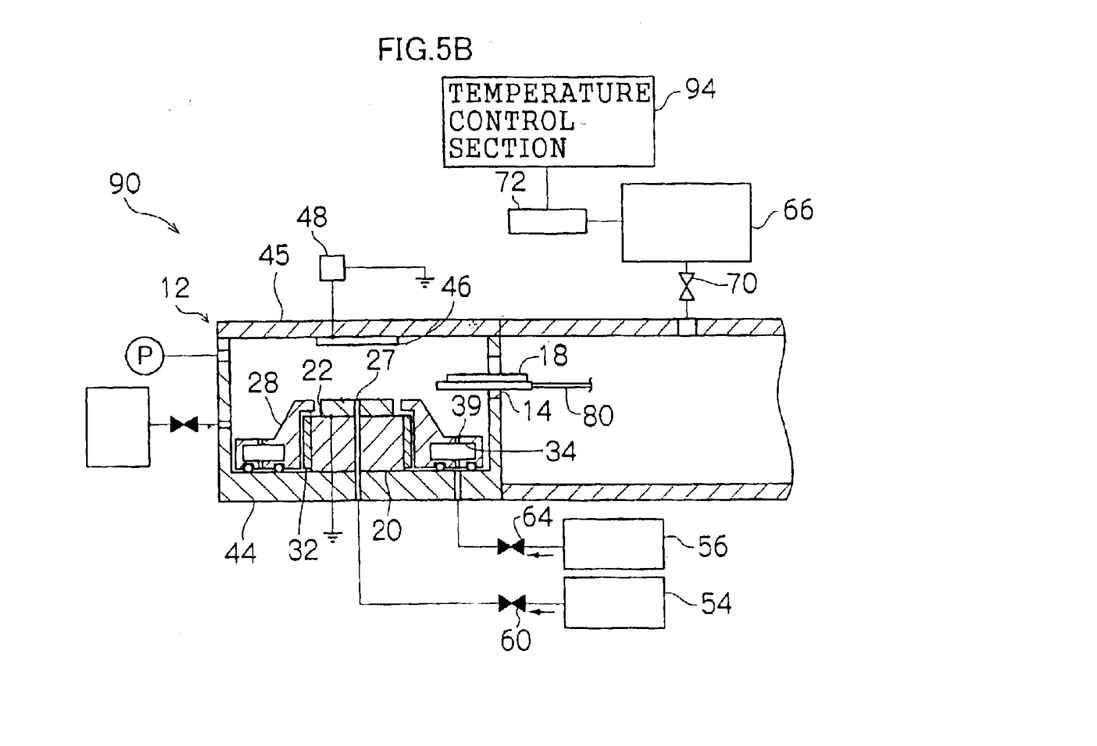

As shown in FIGS. 5A and 5B, the plasma etching device 90 is provided with a transport chamber 92 which serves as an airtight chamber for temporarily storing a wafer 18, adjacent a process chamber 12. The transport chamber 92 has an airtight structure and an internal volume larger than that of the process chamber 12. The transport chamber 92 communicates with the process chamber 12 through an opening portion 14 when an airtight door 16 is opened, and is sealed to be airtight from the process chamber 12 when the airtight door 16 is closed. In the plasma etching device 90, the wafer 18 transported from the process chamber 12 and that transported into the process chamber 12 by a transport arm 80 are temporarily stored in the transport chamber 92. As a result, it is possible to transport the wafer 18 into and out of the process chamber 12 without directly communicating the process chamber 12 with the exterior of the device.

A temperature adjustment gas tank 66 which supplies temperature adjustment gas into the process chamber 12, is connected to the transport chamber 92 through a gas piping 68. Helium gas (He), for example, is stored as the temperature adjustment gas in the temperature adjustment gas tank 66 while being kept in a high pressure state. A control valve 70 the opening and closing states of which can be controlled by a solenoid is arranged halfway along the gas piping 68. The control valve 70 controls whether or not the temperature adjustment gas is supplied from the temperature adjustment gas tank 66 into the transport chamber 92. Similarly to the plasma etching device 10 according to the first embodiment, a temperature adjuster 72 is attached to the temperature adjustment gas tank 66. By heating or cooling the temperature adjustment gas by a heater or a chiller provided inside while circulating the temperature adjustment gas between the temperature adjuster 72 and the temperature adjustment gas tank 66, for example, the temperature adjuster 72 controls the temperature adjustment gas filled up in the temperature adjustment gas tank 66 to have a predetermined target gas temperature.

The plasma etching device 90 is provided with a temperature control section 94 which consists of a CPU, a memory, and the like. On the other hand, an ambient temperature sensor (not shown) which measures the ambient temperature of the interior of the process chamber 12, and a plurality of temperature sensors (not shown) which measure the surface temperatures of predetermined measurement target regions such as electrodes 22 and 46 arranged in the process chamber 12 and the inner wall portion of the process chamber 12, respectively, are arranged in the process chamber 12. The ambient temperature sensor and surface temperature sensors output detection signals corresponding to the ambient temperature of the interior of the process chamber 12 and the surface temperatures of the measurement target regions, respectively, to the temperature control section 94.

A data table, in which target gas temperatures are set using the measured values of the ambient temperature of the interior of the process chamber 12 and the surface temperatures as parameters, is provided in the memory of the temperature control section 94. While the wafer 18 is being etched, the temperature control section 94 determines the measured values of the ambient temperature of the interior of the process chamber 12 and the surface temperatures based on the detection signals from the ambient temperature sensor and the surface temperature sensors, respectively, and reads the target gas temperature corresponding to the measured values of the ambient temperature and the surface temperatures from the data table.

Next, the function of the plasma etching device 90 in the second embodiment constituted as stated above will be described. In FIGS. 5A and 5B, if the valves 60, 64, 70, and 78 are shown black, this indicates that they are closed, and if shown white, this indicates that they are opened.

In the plasma etching device 90, when the wafer 18 is mounted on the cathode electrode 22 first, the airtight door 16 is closed to set the process chamber 12 airtight, and a vacuum generator 50 is actuated to reduce the internal pressure of the process chamber 12 to have a predetermined degree of vacuum. In the plasma etching device 90, if the internal pressure of the process chamber 12 is reduced to have the predetermined degree of vacuum, the control valve 60 is opened to thereby supply cooling gas to the region between the mount surface 23 of the cathode electrode 22 and the wafer 18, and the control valve 64 is opened to thereby supply process gas from nozzle ports 39 into the process chamber 12. At this moment, the process gas can be uniformly diffused into the process chamber 12 in a short amount of time since the internal pressure of the process chamber 12 is reduced.

Thereafter, in the plasma etching device 90, an RF voltage is applied from an RF power supply 48 to the anode electrode 46, thereby generating plasma P between the electrodes 22 and 46 and etching the wafer 18 using the plasma P, as shown in FIG. 5A. At this moment, heat is generated simultaneously with the plasma P in the process chamber 12. Thus, in the plasma etching device 90, coolers (not shown) such as chillers provided on the inner wall portions of the process chamber 12, the electrodes 22 and 46, and the like, respectively, are normally actuated to suppress the surface temperatures of the inner wall portion of the process chamber 12 and the electrodes 22 and 46 from rising and suppress etching rate from changing according to the temperature rise.

After etching of the wafer 18 starts, the temperature control section 94 determines the ambient temperature of the interior of the process chamber 12 and the surface temperatures of the predetermined regions based on the detection signals output from the ambient temperature sensor and the surface temperature sensors provided in the process chamber 12, respectively, at a predetermined timing. Using these measured temperatures as parameters, the temperature control section 94 reads the target gas temperature of the temperature adjustment gas from the data table, and controls the temperature adjuster 72 so that the temperature adjustment gas in the temperature adjustment gas tank 66 becomes equal to the target gas temperature.

In the plasma etching device 90, after the temperature of the temperature adjustment gas in the temperature adjustment gas tank 66 is adjusted to the target gas temperature, the control valve 70 is opened at a timing just before the etching of the wafer 18 is completed. As a result, the temperature adjustment gas in the temperature adjustment gas tank 66 is filled up into the transport chamber 92 through the gas piping 68. At this moment, the quantity of the temperature adjustment gas supplied from the temperature adjustment gas tank 66 into the transport chamber 92 is set so that the internal gas pressure of the transport chamber 92 is sufficiently higher than the gas pressure of the interior of the process chamber 12. In the plasma etching device 90, if a predetermined quantity of temperature adjustment gas is filled up in the transport chamber 92, the control valve 70 is closed.

In the plasma etching device 90, when etching time which is set according to the type or the like of the wafer 18, passes, the RF power supply 48 is turned off and the control valves 60 and 64 are closed. Thereafter, an exhaust valve (not shown) provided in the process chamber 12 is opened to introduce the atmospheric air into the process chamber 12 to thereby return the internal pressure of the process chamber 12 to atmospheric pressure. In the plasma etching device 90, the airtight door 16 is opened next, a transport arm 80 is inserted into the process chamber 12 through the opening portion 14, and the wafer 18, having been etched is transported out of the process chamber 12 by the transport arm 80, as shown in FIG. 5B. At this time, simultaneously with the opening of the airtight door 16, the temperature adjustment gas filled up in the transport chamber 92 flows in large quantities into the process chamber 12 through the opening portion 14 in a short amount of time.

In the plasma etching device 90, the airtight door 16 is opened, and after the passage of a predetermined amount of time, the exhaust valve 78 is opened for another predetermined amount of time, thereby exhausting the temperature adjustment gas and the residual gas after the etching in the process chamber 12 into the exhaust tank 74. After the predetermined amount of time for opening passes, the exhaust valve 78 is closed, and then the next etching target wafer 18 is transported into the process chamber 12 by the transport arm 80 and the airtight door 16 is closed.

In the plasma etching device 90 according to the second embodiment of the invention described so far, while the wafer 18 is being etched, the temperature adjustment gas is supplied from the temperature adjustment gas tank 66 into the transport chamber 92, and the temperature adjuster 72 adjusts the temperature of the temperature adjustment gas supplied from the temperature gas tank 66 and filled up in the transport chamber 92. After the wafer 18 has been etched, the airtight door 16 is opened. It is thereby possible to replace the high-temperature etching gas remaining in the process chamber 12 by the temperature adjustment gas supplied from the transport chamber 92 after etching of the wafer 18 is completed, and it is possible to directly cool the inner wall portion of the process chamber 12 and the regions, such as the electrodes 22 and 46, which face the internal space of the process chamber 12 using the temperature adjustment gas. It is, therefore, possible to change the ambient temperature of the interior of the process chamber 12 and the temperatures of the regions facing the internal space of the process chamber 12 to temperatures corresponding to the temperature of the temperature adjustment gas in a short amount of time, respectively.

At this time, the internal volume of the transport chamber 92 is sufficiently large and the pressure of the temperature adjustment gas filled up in the transport chamber 92 is sufficiently higher than the gas pressure of the interior of the process chamber 12. It is, therefore, possible to supply a large quantity of temperature adjustment gas into the process chamber 12 in a short amount of time, simultaneously with communicating the transport chamber 92 with the process chamber 12. Therefore, it is possible to replace the gases in the overall process chamber 12 by the temperature adjustment gas and to make the temperature distribution of the interior of the process chamber 12 uniform in a short amount of time.

Third Embodiment

A plasma etching device 100 according to a third embodiment of the invention will be described with reference to FIGS. 6A and 6B. Constituent elements of the plasma etching device 100 according to the third embodiment of the invention that are the same as those of the plasma etching device 10 in the first embodiment are denoted by the same reference numerals, respectively, and will not be described herein.

Figure 6A:
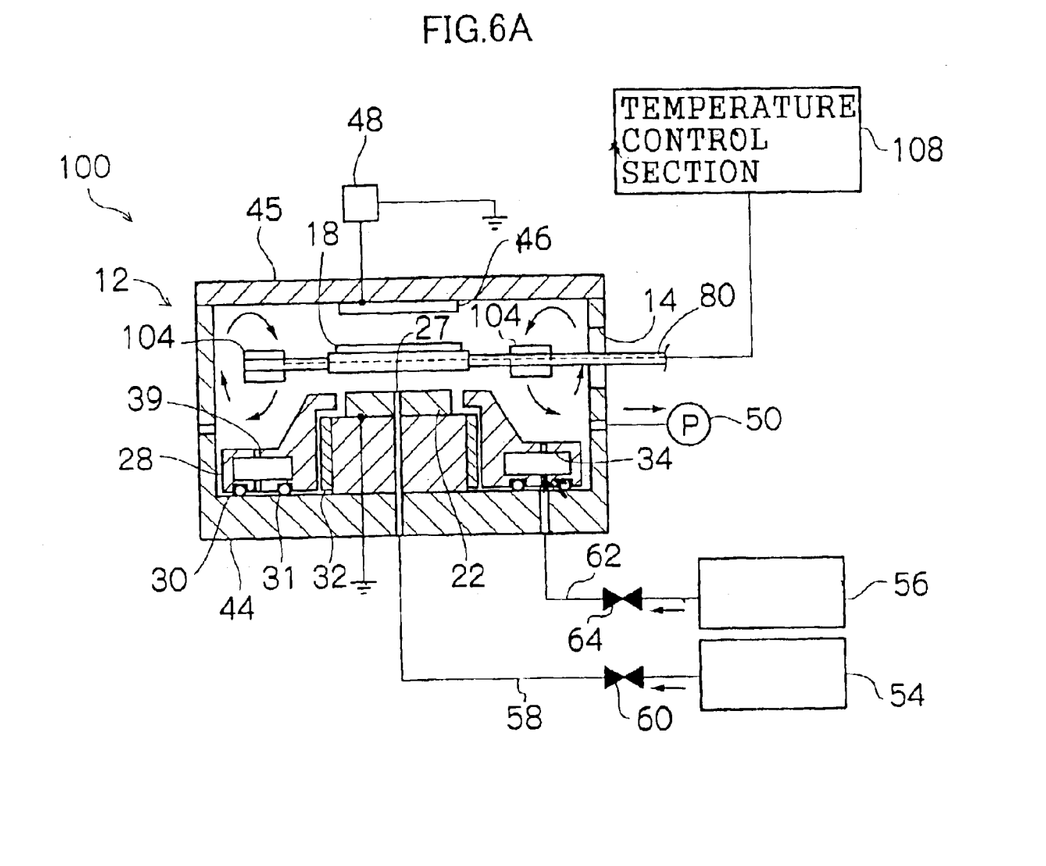
FIG. 6A is a cross-sectional side view showing the schematic configuration of a plasma etching device according to a third embodiment of the invention.
Figure 6B:
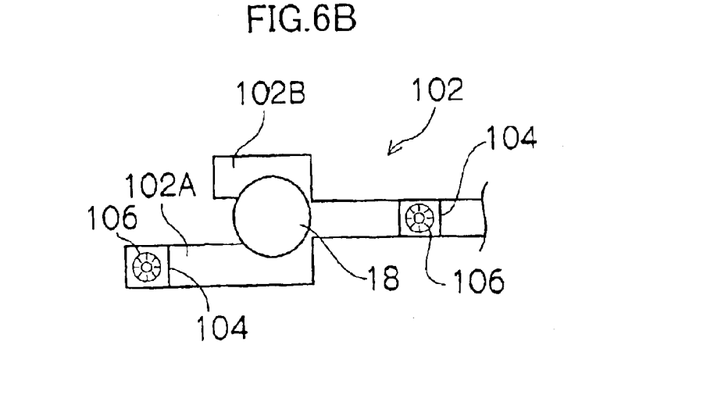
FIG. 6B is a plan view showing the structure of a transport arm provided in the plasma etching device according to the third embodiment.

As shown in FIG. 6B, the plasma etching device 100 is provided with a transport arm 102 having a tip end branched into two portions. One branch portion 102A on the tip end of the transport arm 102 is longer than the other branch portion 102B. As shown in FIG. 6B, air-cooling units 104 are disposed on the tip end of one branch portion 102A and the proximal end of the branch portions 102A and 102B of the transport arm 102, respectively, as shown in FIG. 6B. Each air-cooling unit 104 includes a small-sized fan 106 and a plurality of Peltier elements (not shown) provided to surround the fan 106 from the outer peripheral side thereof. The fan 106 has an air inlet port provided on the upper surface side and an air current discharge port provided on the lower surface side. In addition, the heat absorption surfaces of the plural Peltier elements are arranged to face the path of the air current generated by the fan 106 and the heat emission surfaces thereof are arranged to be fixedly attached to the inner surface portion of the transport arm 102. The transport arm 102 is made of a high heat conductivity material, and functions as a heat sink which discharges the heat emitted from the heat emission surfaces of the Peltier elements to the exterior of the device.

In the plasma etching device 100, the two air-cooling units 104 are supported to be symmetrically located on both sides (left side and right side) of the interior of the process chamber 12 while the transport arm 102 is inserted into the process chamber 12, as shown in FIG. 6A. The plasma etching device 100 is also provided with a temperature control section 108 which consists of a CPU, a memory, and the like. The temperature control section 108 controls the fan 106 in each air-cooling unit 104 to be turned on and off and controls thermal transfer quantity transferred by the Peltier elements.

On the other hand, an ambient temperature sensor (not shown) which measures the ambient temperature of the interior of the process chamber 12, and a plurality of temperature sensors (not shown) which measure the surface temperatures of predetermined measurement target regions such as electrodes 22 and 46 arranged in the process chamber 12 and the inner wall portion of the process chamber 12, respectively, are arranged in the process chamber 12. The ambient temperature sensor and surface temperature sensors output detection signals corresponding to the ambient temperature of the interior of the process chamber 12 and the surface temperatures of the measurement target regions, respectively, to the temperature control section 108.

A data table, in which target air current temperatures are set using the measured values of the ambient temperature of the interior of the process chamber 12 and the surface temperatures as parameters, is provided in the memory of the temperature control section 108. After etching of one wafer 18 is completed, the temperature control section 108 determines the measured values of the ambient temperature of the interior of the process chamber 12 and the surface temperatures based on the detection signals from the ambient temperature sensor and the surface temperature sensors, respectively, and reads the target air current temperature corresponding to the measured values of the ambient temperature and the surface temperatures from the data table.

Next, the operation of the plasma etching device 100 in the third embodiment constituted as stated above will be described. In FIG. 6A, if controls valves 60 and 64 are shown black, this indicates that they are closed, and if shown white, this indicates that they are opened.

In the plasma etching device 100, when the wafer 18 is mounted on the cathode electrode 22 first, the airtight door 16 is closed to set the process chamber 12 airtight, and a vacuum generator 50 is actuated to reduce the internal pressure of the process chamber 12 to have a predetermined degree of vacuum. In the plasma etching device 100, if the internal pressure of the process chamber 12 is reduced to have the predetermined degree of vacuum, the control valve 60 is opened to thereby supply cooling gas to the region between the mount surface 23 of the cathode electrode 22 and the wafer 18, and the control valve 64 is opened to thereby supply process gas from nozzle ports 39 into the process chamber 12. At this moment, the process gas can be uniformly diffused into the process chamber 12 in a short amount of time since the internal pressure of the process chamber 12 is reduced.

Thereafter, in the plasma etching device 100, an RF voltage is applied from an RF power supply 48 to the anode electrode 46, thereby generating plasma P between the electrodes 22 and 46 and etching the wafer 18 using the plasma P. At this moment, heat is generated simultaneously with the plasma P in the process chamber 12. Thus, in the plasma etching device 100, coolers (not shown) such as chillers provided on the inner wall portions of the process chamber 12, the electrodes 22 and 46, and the like, respectively, are normally actuated to suppress the surface temperatures of the inner wall portion of the process chamber 12 and the electrodes 22 and 46 from rising and suppress etching rate from changing according to the temperature rise.

In the plasma etching device 10Q, when etching time which is set according to the type or the like of the wafer 18, passes, the RF power supply 48 is turned off and the control valves 60 and 64 are closed. Thereafter, an exhaust valve (not shown) provided in the process chamber 12 is opened to introduce the atmospheric air into the process chamber 12 to thereby return the internal pressure of the process chamber 12 to atmospheric pressure. On the other hand, right after etching of the wafer 18 is completed, the temperature control section 108 determines the ambient temperature of the interior of the process chamber 12 and the surface temperatures of the predetermined regions based on the detection signals output from the ambient temperature sensor and the surface temperature sensors provided in the process chamber 12, respectively. Thereafter, the temperature control section 108 starts actuating the fan 106 of each air-cooling unit 104, reads the target air current temperature from the data table using the measured temperatures determined based on the detection signals from the respective temperature sensors as parameters, and controls the Peltier elements so that the temperature of the air current generated by the fan 106 becomes equal to the target air current temperature.

Next, in the plasma etching device 100, the airtight door 16 is opened, and the transport arm 102 is inserted into the process chamber 12 through the opening portion 14, as shown in FIG. 6A. When inserting the transport arm 102 into the process chamber 12, the air currents generated by the two air-cooling units 104 arranged in the transport arm 102 are blown into the process chamber 12 and circulate in the process chamber 12, respectively. In the plasma etching device 100, after the transport arm 102 is held in the process chamber 12 for predetermined time, the wafer 18, having been etched is held by the transport arm 102 and is transported out of the process chamber 12 by the transport arm 102. In the plasma etching device 100, after transporting the wafer 18 from the process chamber 12, the next etching target wafer 18 is transported into the process chamber 12 by the transport arm 102. While transporting the wafer 18 into the process chamber 12, the air currents generated by the two air-cooling units 104 are blown into the process chamber 12 and circulate in the process chamber 12, respectively. In the process chamber 12, the airtight door (not shown) is closed, and etching of the next wafer 18 starts.

In the plasma etching device 100 according to the third embodiment of the invention described so far, when the transport arm 102 is inserted into the process chamber 12, the fans 106 of the air-cooling units 104 supply air currents into the process chamber 12, respectively, and the Peltier elements adjust the temperatures of the air currents supplied from the fans 106 into the process chamber 12. As a result, the high-temperature etching gas remaining in the process chamber is stirred and replaced by the air currents supplied from the fans 106, and the regions, such as the inner wall portion of the process chamber 12 and the electrodes, which face the internal space of the process chamber 12 are cooled by the air currents. It is, therefore, possible to change the ambient temperature of the interior of the process chamber 12 and the temperatures of the regions facing the internal space of the process chamber 12 to temperatures corresponding to the temperature of the air currents in a short amount of time, respectively.

At this time, the air currents are supplied into the process chamber 12 through the discharge ports of the fans 106 provided in the transport arm 102. Therefore, it is possible to adjust the internal temperature of the process chamber 12 while effectively using the time after etching of one wafer 18 is completed and before the next wafer 18 is transported into the process chamber 12 and etching of the next wafer 18 starts.

In the plasma etching device 100 according to the third embodiment, nozzle ports may be formed in the transport arm 102 in place of the air-cooling units 104, and temperature adjustment gas supplied from a temperature adjustment gas tank provided outside of the process chamber 12 may be supplied into the process chamber 12 through the nozzle ports. In this case, by supplying the temperature adjustment gas the temperature of which is adjusted by a temperature adjuster or the like into the process chamber 12 through the nozzle ports of the transport arm 102, it is possible to make effective use of the time for which one wafer 18 is exchanged to the next wafer 18, and to adjust the ambient temperature of the interior of the process chamber 12 and the temperatures of the regions facing the internal space of the process chamber 12 to respective temperatures corresponding to the temperature of the temperature adjustment gas.

As described so far, the plasma etching device according to the invention can adjust the ambient temperature of the interior of the process chamber and the temperatures of the regions facing the internal space of the process chamber to the respective target temperatures with high accuracy in a short amount of time after etching of the etching target material is completed.

Further, a first other aspect of the invention, there is provided that a semiconductor is formed by using the plasma etching device of the invention. Further, a second other aspect of the invention, there is provided that a semiconductor forming method is included process employing the plasma etching device of the invention.

What is claimed is:

1. A plasma etching device, including an airtight process chamber having arranged therein so as to face each other an upper electrode and a lower electrode which has an upper surface portion on which an etching target material is mounted, for generating plasma between the upper electrode and the lower electrode, and etching the etching target material, the plasma etching device comprising:

a transport member for transporting the etching target member into and out of the process chamber;

an air current generator having an air current discharge port provided on the transport member, and supplying an air current from the air current discharge port into the process chamber when the transport member is inserted into the process chamber, wherein the air current generator comprises a rotary fan; and a temperature adjuster for adjusting a temperature of the air current to be supplied by the air current generator into the process chamber.

2. A plasma etching device according to claim 1, wherein the air current generator comprises a Peltier element at an outer peripheral portion of the fan, the Peltier element adjusting the temperature of the air current.

3. A plasma etching device according to claim 1, wherein the air current generator comprises a gas supply path for supplying temperature adjustment gas, the temperature adjustment gas being supplied from outside of the process chamber.

4. A plasma etching device according to claim 1, wherein a temperature sensor is provided in the process chamber, and the temperature adjuster adjusts the temperature of the air current based on a temperature detected by the temperature sensor.

5. A plasma etching device according to claim 4, wherein the temperature sensor is arranged to detect at least one of an ambient temperature of an interior of the process chamber, a temperature of the upper electrode, a temperature of the lower electrode, and a temperature of a predetermined portion of an inner wall of the process chamber.

6. A plasma etching device according to claim 4, further comprising a temperature controller, wherein the temperature controller stores a preset target temperature corresponding to the detected temperature, and controls the temperature adjuster so that the temperature of the air current becomes equal to the target temperature corresponding to the detected temperature.

* * * * *